(12) United States Patent
Kondo et al.

(10) Patent No.: US 11,240,912 B2
(45) Date of Patent: Feb. 1, 2022

(54) MULTILAYER WIRING SUBSTRATE

(71) Applicant: Murata Manufacturing Co., Ltd., Kyoto-fu (JP)

(72) Inventors: Masao Kondo, Nagaokakyo (JP); Shigeki Koya, Nagaokakyo (JP); Kenji Sasaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 141 days.

(21) Appl. No.: 16/814,902

(22) Filed: Mar. 10, 2020

(65) Prior Publication Data

US 2020/0296839 A1   Sep. 17, 2020

(30) Foreign Application Priority Data

Mar. 11, 2019   (JP) .............................. JP2019-043951

(51) Int. Cl.
*H05K 1/02*   (2006.01)
*H05K 1/11*   (2006.01)
(Continued)

(52) U.S. Cl.
CPC ....... *H05K 1/0298* (2013.01); *H01L 21/4857* (2013.01); *H01L 23/5383* (2013.01);
(Continued)

(58) Field of Classification Search
CPC ........ H05K 1/0298; H05K 1/115; H05K 1/14; H05K 1/0203; H05K 1/0206; H05K 1/116; H05K 1/112; H05K 3/245; H05K 3/4644; H05K 3/3452; H05K 2201/09618; H05K 2201/10734; H05K 2201/0989; H05K 2201/099; H01L 21/4857; H01L 21/563; H01L 23/5385; H01L 23/5383;
(Continued)

(56) References Cited

U.S. PATENT DOCUMENTS

2007/0035009 A1*   2/2007   Hwang ............. H01L 23/49838
257/700
2007/0121273 A1*   5/2007   Yamamoto ............. H05K 1/186
361/306.2

FOREIGN PATENT DOCUMENTS

JP    H08-148839 A    6/1996
JP    2001-102483 A    4/2001
(Continued)

*Primary Examiner* — Roshn K Varghese
(74) *Attorney, Agent, or Firm* — Studebaker & Brackett PC

(57) ABSTRACT

A cavity elongated in one direction is formed in a protective film covering the conductive pattern of the topmost conductive layer of a multilayer wiring substrate. The cavity exposes part of the conductive pattern. A first via-conductor extends downward from the conductive pattern of the topmost conductive layer at least until that of a second conductive layer. Second via-conductors extend downward from the conductive pattern of the second or third conductive layer at least until that of a conductive layer one below. As viewed from above, the first via-conductor and the cavity partially overlap each other. At least two second via-conductors are disposed to sandwich the cavity therebetween. The difference between the smallest gap between the cavity and the second via-conductor at one side and that between the cavity and the second via-conductor at the other side is smaller than the smallest gap between the cavity and the second via-conductors.

16 Claims, 14 Drawing Sheets

(51) Int. Cl.
*H05K 3/24* (2006.01)
*H01L 21/48* (2006.01)
*H01L 23/538* (2006.01)
*H01L 23/467* (2006.01)

(52) U.S. Cl.
CPC .......... *H01L 23/5385* (2013.01); *H05K 1/115* (2013.01); *H05K 3/245* (2013.01); *H01L 23/467* (2013.01); *H05K 2201/09618* (2013.01)

(58) Field of Classification Search
CPC ............. H01L 23/467; H01L 23/49833; H01L 23/49827; H01L 23/49838; H01L 23/3677; H01L 23/49822
See application file for complete search history.

(56) References Cited

FOREIGN PATENT DOCUMENTS

| | | |
|---|---|---|
| JP | 2010-080572 A | 4/2010 |
| JP | 2010-267944 A | 11/2010 |
| JP | 2018-142688 A | 9/2018 |

* cited by examiner

MULTILAYER WIRING SUBSTRATE

CROSS-REFERENCE TO RELATED APPLICATION

This application claims benefit of priority to Japanese Patent Application No. 2019-043951, filed Mar. 11, 2019, the entire content of which is incorporated herein by reference.

BACKGROUND

Technical Field

The present disclosure relates to a multilayer wiring substrate.

Background Art

During the operation of a semiconductor integrated circuit (IC) chip including a power amplifier, a transistor of the power amplifier generates heat. The performance of the power amplifier is degraded in accordance with a rise in the operating temperature of the transistor. To handle this situation, it is desirable to efficiently dissipate heat from the transistor (heating source) to outside the IC chip and a module substrate having the IC chip mounted thereon. In the configuration in which the IC chip is connected to the module substrate via bumps, a current path from a ground terminal of the transistor, that is, the emitter or the source of the transistor, to a ground outer electrode of the module substrate via the bumps serves as the major heat dissipation path from the transistor to outside.

Japanese Unexamined Patent Application Publication No. H08-148839 discloses a hybrid integrated circuit device that exhibits a high thermal conductivity for conducting heat to a heat dissipation plate and that can be used stably. The hybrid integrated circuit device includes a multilayer ceramic substrate and a heat dissipation plate. A flip-chip element is mounted on the front surface of the multilayer ceramic substrate, and the heat dissipation plate is connected to the back side of the multilayer ceramic substrate via a heat-dissipation thin metal layer. In the multilayer ceramic substrate, plural heat-conducting through-holes are formed from the bottom portion of the flip-chip element toward the heat-dissipation thin metal layer. More heat-conducting through-holes are provided as they are located farther away from the flip-chip element and closer to the heat-dissipation thin metal layer.

SUMMARY

Typically, an output-stage transistor of a power amplifier circuit is constituted by plural transistor cells connected in parallel with each other. If the thermal conductivity in a heat dissipation path for the operating region (emitter region) of the same transistor cell varies or the thermal conductivity in heat dissipation paths for the operating regions of the plural transistor cells varies, the temperature of heat generated in the operating region or in the plural operating regions does not rise uniformly. As a result, during the power amplifying operation, the power density becomes different within the operating region of the same transistor cell and among the operating regions of the plural transistor cells. This decreases the performance, such as output, efficiency, and gain, of the power amplifier as a whole.

In the related art, although the heat dissipation characteristics are enhanced, the issue concerning variations in the temperature rise within the operating region of the same transistor cell and among the operating regions of plural transistor cells is not addressed.

Accordingly, the present disclosure provides a multilayer wiring substrate that is able to reduce variations in the temperature rise within operating regions of a transistor.

According to one aspect of the present disclosure, there is provided a multilayer wiring substrate including conductive layers and insulating layers alternately stacked on each other. Each of the conductive layers has a conductive pattern. A semiconductor device is mounted on a top surface of the multilayer wiring substrate. The multilayer wiring substrate includes a protective film, at least one first via-conductor, and plural second via-conductors. The protective film covers the conductive pattern of a first conductive layer, which is the topmost layer. At least one cavity elongated in one direction is formed in the protective film to expose part of the conductive pattern of the first conductive layer. The at least one first via-conductor extends downward from the conductive pattern of the first conductive layer at least until the conductive pattern of a second conductive layer, which is the second layer. The plural second via-conductors extend downward from the conductive pattern of the second conductive layer or a third conductive layer, which is the third layer, at least until the conductive pattern of a conductive layer one below the second or third conductive layer. When one of a longitudinal direction of the at least one cavity and a direction perpendicular to the longitudinal direction and parallel with the top surface of the multilayer wiring substrate is defined as a first direction: as viewed from above, the at least one first via-conductor and the at least one cavity partially overlap each other; at least two of the plural second via-conductors are disposed separately from the at least one cavity so as to sandwich the at least one cavity therebetween in the first direction; and, among the second via-conductors sandwiching the at least one cavity therebetween in the first direction, the smallest gap between the at least one cavity and at least one second via-conductor disposed at one side of the at least one cavity is defined as a first smallest gap, the smallest gap between the at least one cavity and at least one second via-conductor disposed at the other side of the at least one cavity is defined as a second smallest gap, the smallest gap between the at least one cavity and the second via-conductors is defined as the overall smallest gap, and a difference between the first smallest gap and the second smallest gap is smaller than the overall smallest gap.

According to another aspect of the present disclosure, there is provided a multilayer wiring substrate including conductive layers and insulating layers alternately stacked on each other. Each of the conductive layers has a conductive pattern. A semiconductor device is mounted on a top surface of the multilayer wiring substrate. The multilayer wiring substrate includes a protective film, at least one first via-conductor, and plural second via-conductors. The protective film covers the conductive pattern of a first conductive layer, which is the topmost layer. At least one cavity elongated in one direction is formed in the protective film to expose part of the conductive pattern of the first conductive layer. The at least one first via-conductor extends downward from the conductive pattern of the first conductive layer at least until the conductive pattern of a second conductive layer, which is the second layer. The plural second via-conductors extend downward from the conductive pattern of the second conductive layer or a third conductive layer, which is the third layer, at least until the conductive pattern of a conductive layer one below the second or third conductive layer. When one of a longitudinal direction of the at least one cavity and a direction perpendicular to the longitudinal direction and parallel with the top surface of the multilayer wiring substrate is defined as a first direction, as viewed from above, at least one of one or some of the at least one first via-conductor and one or some of the plural second via-conductors overlaps the at least one cavity, and extends from inside the at least one cavity toward both sides in the first direction so as to at least partially protrude from the at least one cavity.

The first via-conductors and the second via-conductors form heat dissipation paths. Arranging the first and second via-conductors as described above enhances the symmetrical characteristics of the heat dissipation paths in the first direction. It is thus possible to reduce variations in the temperature rise within operating regions of a transistor included in a semiconductor device.

Other features, elements, characteristics and advantages of the present disclosure will become more apparent from the following detailed description of preferred embodiments of the present disclosure with reference to the attached drawings.

DETAILED DESCRIPTION

First Embodiment

A multilayer wiring substrate according to a first embodiment will be described below with reference to FIGS. 1A through 4.

Figure 1A:
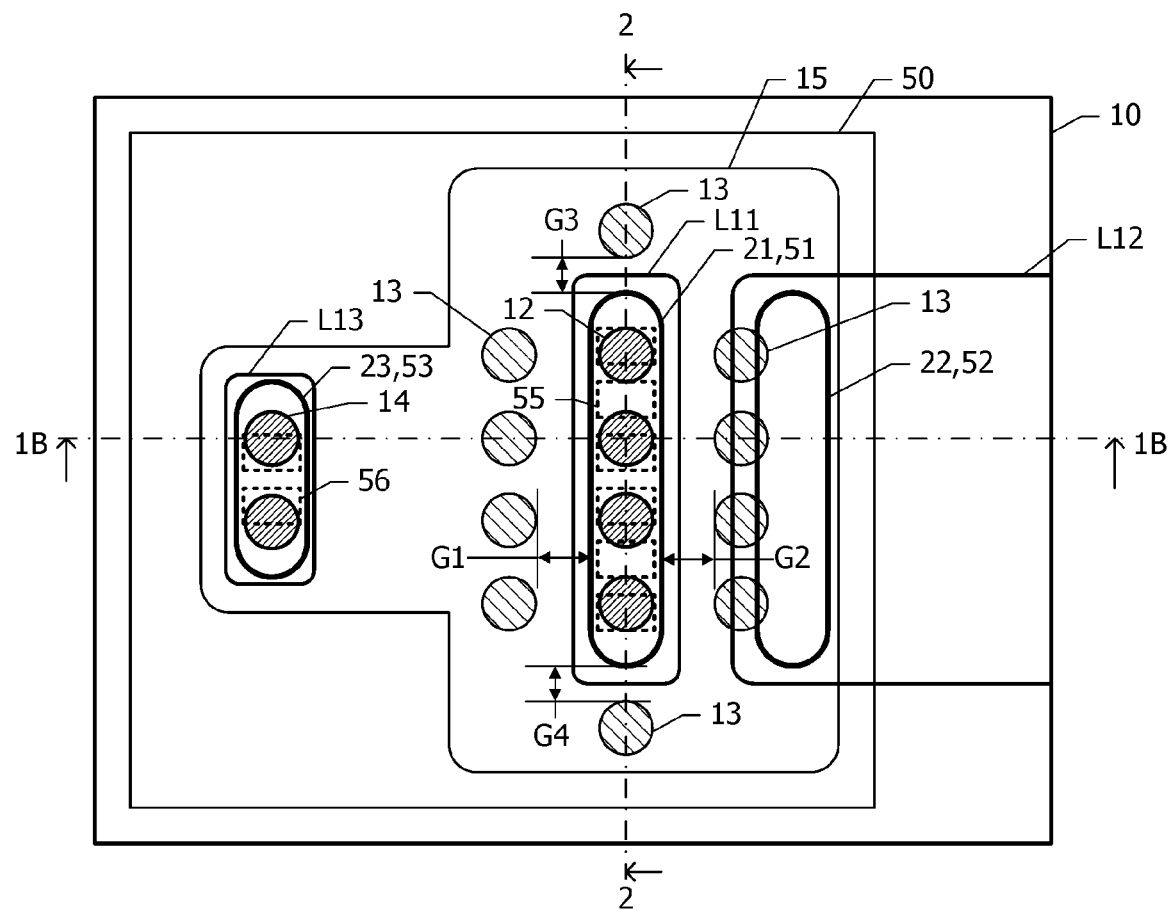
FIG. 1A is a plan view illustrating the positional relationships among the elements of a multilayer wiring substrate according to a first embodiment and those of a semiconductor device (semiconductor chip) mounted on the multilayer wiring substrate.
Figure 1B:
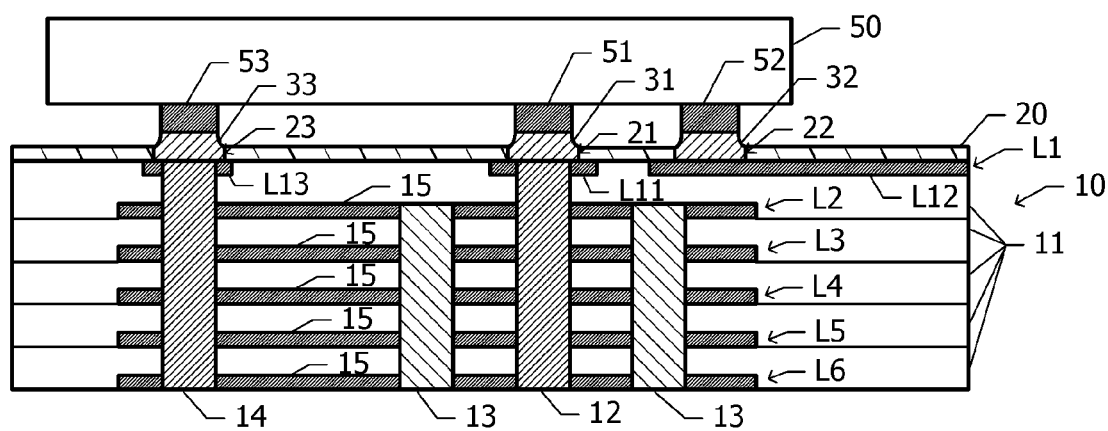
FIG. 1B is a sectional view taken along long dashed dotted line 1B-1B in FIG. 1A.
Figure 2:
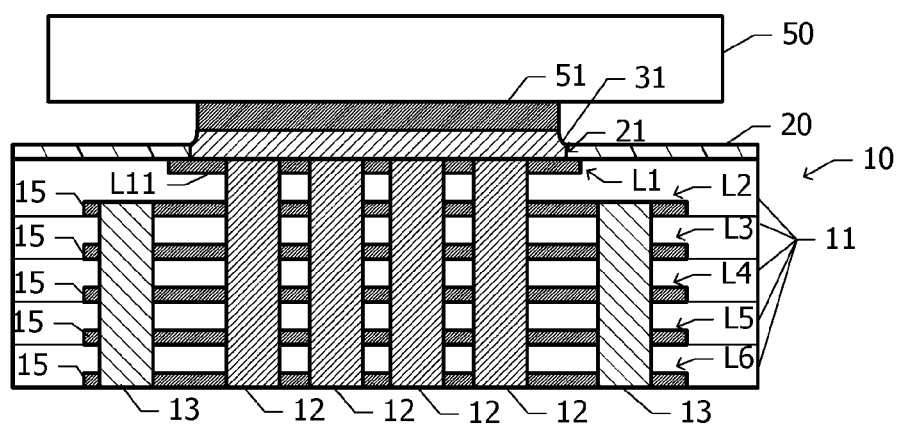
FIG. 2 is a sectional view taken along long dashed dotted line 2-2 in FIG. 1A.

FIG. 1A is a plan view illustrating the positional relationships among the elements of a multilayer wiring substrate 10 according to the first embodiment and those of a semiconductor device (semiconductor chip) 50 mounted on the multilayer wiring substrate 10. FIG. 1B is a sectional view taken along long dashed dotted line 1B-1B in FIG. 1A. FIG. 2 is a sectional view taken along long dashed dotted line 2-2 in FIG. 1A.

The multilayer wiring substrate 10 (FIGS. 1B and 2) includes six conductive layers and five insulating layers 11 alternately stacked on each other. Each conductive layer includes at least one conductive pattern. The multiple conductive layers will be called first through sixth conductive layers L1 through L6 in order from the top surface to the bottom surface of the multilayer wiring substrate 10. The conductive layers are not limited to six layers and the insulating layers 11 are not limited to five layers. Typically, the topmost layer and the bottommost layer are conductive layers, and more conductive layers are disposed than insulating layers by one. On the top surface (mounting surface) of the multilayer wiring substrate 10, the semiconductor device 50 is mounted. As the multilayer wiring substrate 10, an interstitial via-hole (IVH) substrate or a build-up substrate, for example, may be used.

The semiconductor device 50 includes plural output-stage transistor cells 55 forming an output-stage transistor and plural driver-stage transistor cells 56 forming a driver-stage transistor. The plural output-stage transistor cells 55 are connected in parallel with each other and are arranged in one row. The plural driver-stage transistor cells 56 are also connected in parallel with each other and are arranged in one row. The output-stage transistor cells 55 and the driver-stage transistor cells 56 are arranged in parallel with each other. Each of the plural output-stage transistor cells 55 and the plural driver-stage transistor cells 56 is constituted by a heterojunction bipolar transistor (HBT) and has an operating region elongated in a direction perpendicular to the arranging direction. The operating region is defined as a region where an emitter current substantially flows at an emitter-base junction. For example, as viewed from above, the operating region substantially matches a region covered with a metal-made emitter electrode connected to an emitter layer.

Bumps 51, 52, and 53 are disposed for the semiconductor device 50. As viewed from above, the bump 51 includes the operating regions of the plural output-stage transistor cells 55 therein and is connected to the emitters of the plural output-stage transistor cells 55. The bump 52 is connected to the collectors of the plural output-stage transistor cells 55 via collector wiring extending from the collectors. The bump 51, which is connected to the emitters of the output-stage transistor cells 55, is a ground bump, while the bump 52, which is connected to the collectors of the output-stage transistor cells 55, is an output bump. As viewed from above, the bump 53 includes the operating regions of the plural driver-stage transistor cells 56 therein and is connected to the emitters of the plural driver-stage transistor cells 56.

The first conductive layer L1, which is the topmost layer of the multilayer wiring substrate 10, includes conductive patterns L11, L12, and L13. An insulating protective film (solder resist film) 20 is disposed to cover the conductive patterns L11, L12, and L13. Cavities 21, 22, and 23 are formed in the protective film 20 to partially expose the conductive patterns L11, L12, and L13, respectively. The conductive patterns L11, L12, and L13 exposed in the cavities 21, 22, and 23 as viewed from above serve as lands to be connected to the ground bump 51, the output bump 52, and the driver-stage bump 53, respectively.

The cavities 21, 22, and 23 each have a planar shape elongated in one direction, as viewed from above. The longitudinal directions of the cavities 21, 22, and 23 are parallel with each other. The bumps 51, 52, and 53 of the semiconductor device 50 are respectively connected via solders 31, 32, and 33 to the conductive patterns L11, L12, and L13 exposed in the cavities 21, 22, and 23 as viewed from above.

Plural first via-conductors 12 extend from the conductive pattern L11 of the first conductive layer L1 toward the bottom surface and reach the conductive pattern of the sixth conductive layer L6. The six conductive patterns of the first through sixth conductive layers L1 through L6 are connected to each other by the first via-conductors 12. The conductive patterns connected to the first via-conductors 12 are connected to the emitters of the output-stage transistor cells 55 via the ground bump 51. The conductive patterns connected to the first via-conductors 12 will be called ground conductors 15.

Plural second via-conductors 13 extend from the ground conductor 15 of the second conductive layer L2 toward the bottom surface and reach the ground conductor 15 of the sixth conductive layer L6. The five ground conductors 15 of the second through sixth conductive layers L2 through L6 are connected to each other by the second via-conductors 13. The ground conductor 15 of the sixth conductive layer L6, which is the bottommost layer of the multilayer wiring substrate 10, is connected to a ground conductor of a motherboard, for example. The ground conductor of a motherboard, for example, is electrically set to be a ground potential and thermally serves as a heat sink.

Plural third via-conductors 14 extend from the conductive pattern L13 of the first conductive layer L1 toward the bottom surface and reach the ground conductor 15 of the sixth conductive layer L6. The conductive patterns connected to the third via-conductors 14 are connected to the emitters of the driver-stage transistor cells 56 via the bump 53.

The conductive pattern L12 of the first conductive layer L1 is connected to the collectors of the output-stage transistor cells 55 via the solder 32 and the output bump 52.

The positional relationships among the elements of the multilayer wiring substrate 10 and those of the semiconductor device 50 will be discussed below with reference to FIG. 1A. In FIG. 1A, the first via-conductors 12 and the third via-conductors 14 are indicated by the relatively densely hatched portions, while the second via-conductors 13 are indicated by the relatively sparsely hatched portions.

As viewed from above, the cavities 21, 22, and 23 substantially match the ground bump 51, the output bump 52, and the driver-stage bump 53, respectively. The cavities 21, 22, and 23 each have a planar shape elongated in one direction and are disposed in parallel with each other. The cavity 21 will be called the ground cavity 21, while the cavity 22 will be called the output cavity 22. The plural first via-conductors 12 are arranged in one row in a direction parallel with the longitudinal direction of the ground cavity 21 and partially overlap the ground cavity 21. Hereinafter, the longitudinal direction of the ground cavity 21 may simply be called the longitudinal direction. The direction perpendicular to the longitudinal direction will be called the widthwise direction.

In the first embodiment, the plural first via-conductors 12 are included in the ground cavity 21 as viewed from above. The plural third via-conductors 14 are arranged in one row in a direction parallel with the longitudinal direction and are included in the cavity 23 as viewed from above. The output cavity 22 is located on the side opposite the driver-stage transistor cells 56, as viewed from the ground cavity 21.

Some of the second via-conductors 13 are located at positions to sandwich the ground cavity 21 in the widthwise direction. The other second via-conductors 13 are located at positions to sandwich the ground cavity 21 in the longitudinal direction. All the second via-conductors 13 are disposed separately from the ground cavity 21 with a gap therebetween. In this manner, the second via-conductors 13 surround the ground cavity 21 in the four directions. The second via-conductors 13 located close to the output cavity 22 as viewed from the ground cavity 21 partially overlap the conductive pattern L12 of the first conductive layer L1.

Figure 3A:
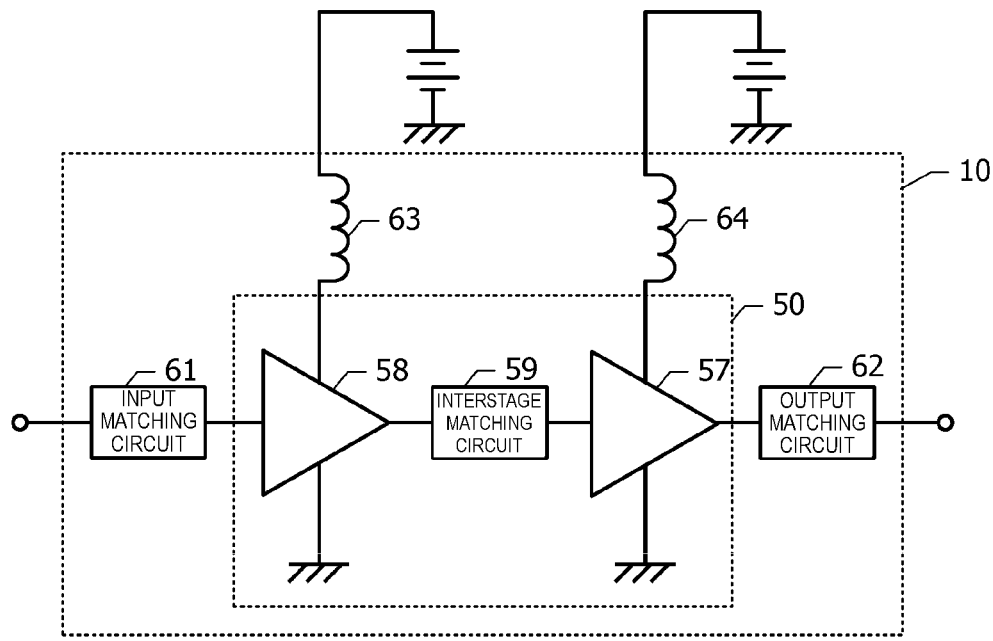
FIG. 3A is a block diagram of a power amplifier module including the multilayer wiring substrate of the first embodiment and the semiconductor device mounted on the multilayer wiring substrate.

FIG. 3A is a block diagram of a power amplifier module including the multilayer wiring substrate 10 of the first embodiment and the semiconductor device 50 mounted on the multilayer wiring substrate 10. In the semiconductor device 50, an output-stage transistor 57, a driver-stage transistor 58, and an interstage matching circuit 59 are formed. The output-stage transistor 57 is constituted by the plural output-stage transistor cells 55 (FIG. 1A), while the driver-stage transistor 58 is constituted by the plural driver-stage transistor cells 56 (FIG. 1A).

On the multilayer wiring substrate 10, an input matching circuit 61, an output matching circuit 62, and inductors 63 and 64 are mounted. Direct-current (DC) power is supplied from external sources to the driver-stage transistor 58 and the output-stage transistor 57 via the inductors 63 and 64, respectively. A radio-frequency (RF) signal is input into the driver-stage transistor 58 via the input matching circuit 61. The RF signal is amplified in the driver-stage transistor 58 and is then input into the output-stage transistor 57 via the interstage matching circuit 59. The RF signal is amplified in the output-stage transistor 57 and is then output via the output matching circuit 62.

Figure 3B:
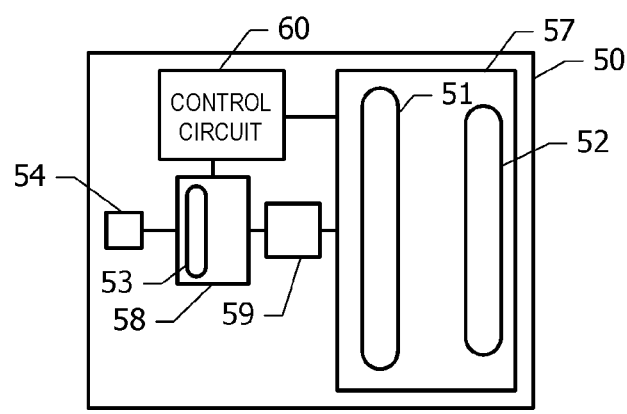
FIG. 3B illustrates an example of the layout within the chip of the semiconductor device.

FIG. 3B illustrates an example of the layout within the chip of the semiconductor device 50. On a semiconductor substrate, an input terminal 54, the driver-stage transistor 58, the interstage matching circuit 59, and the output-stage transistor 57 are disposed from left to right in FIG. 3B. Within the region where the driver-stage transistor 58 is disposed, the driver-stage bump 53, which is used for making the emitters of the driver-stage transistor cells 56 (FIG. 1A) be grounded, is disposed. Within the region where the output-stage transistor 57 is disposed, the ground bump 51, which is used for making the emitters of the output-stage transistor cells 55 (FIG. 1A) be grounded, and the output bump 52 connected to the collectors of the output-stage transistor cells 55 are disposed. On the semiconductor substrate, a region for mounting a control circuit 60 is also reserved. The control circuit 60 supplies a base bias to the driver-stage transistor 58 and the output-stage transistor 57.

Advantages of the first embodiment will be discussed below.

The ground bump 51, the solder 31, the conductive pattern L11 of the first conductive layer L1, the first via-conductors 12, the second via-conductors 13, and the ground conductors 15 form heat dissipation paths through which heat generated from the operating regions of the output-stage transistor cells 55 (FIG. 1A) is conducted to a motherboard, for example. A heat dissipation path from the operating region of an output-stage transistor cell 55 to a motherboard, for example, may simply be called a heat dissipation path.

In the first embodiment, the plural first via-conductors 12 are disposed so that they are included in the ground cavity 21 as viewed from above. Additionally, the second via-conductors 13 are disposed at both sides in the widthwise direction, as viewed from the ground cavity 21. With this arrangement, more heat dissipation paths are formed compared with the configuration in which the second via-conductors 13 are disposed only at one side in the widthwise direction, and also, the symmetrical characteristics of the heat dissipation paths in the widthwise direction are enhanced. As a result, the average temperature rise can be regulated, and variations in the temperature rise in the widthwise direction can also be reduced, thereby enhancing the temperature uniformity. In other words, the temperature can be made uniform in the longitudinal direction of the operating region of the same output-stage transistor cell 55.

Likewise, the second via-conductors 13 are disposed at both sides in the longitudinal direction, as viewed from the ground cavity 21. With this arrangement, more heat dissipation paths are formed compared with the configuration in which the second via-conductor 13 is disposed only at one side in the longitudinal direction, and the symmetrical characteristics of the heat dissipation paths in the longitudinal direction are enhanced. As a result, the average temperature rise can be regulated, and variations in the temperature rise in the longitudinal direction can also be reduced, thereby enhancing the temperature uniformity. In other words, the temperature can be made uniform among the operating regions of the plural output-stage transistor cells 55.

A desirable arrangement of the second via-conductors 13 will be discussed below with reference to FIG. 4.

Among the plural second via-conductors 13 sandwiching the ground cavity 21 therebetween in the widthwise direction, the smallest gap between the ground cavity 21 and at least one second via-conductor 13 disposed at one side (left side in FIG. 1A) of the ground cavity 21 is defined as the first smallest gap G1, and the smallest gap between the ground cavity 21 and at least one second via-conductor 13 disposed at the other side (right side in FIG. 1A) of the ground cavity 21 is defined as the second smallest gap G2. Among the plural second via-conductors 13 sandwiching the ground cavity 21 therebetween in the longitudinal direction, the smallest gap between the ground cavity 21 and at least one second via-conductor 13 disposed at one side (top side in FIG. 1A) of the ground cavity 21 is defined as the third smallest gap G3, and the smallest gap between the ground cavity 21 and at least one second via-conductor 13 disposed at the other side (bottom side in FIG. 1A) of the ground cavity 21 is defined as the fourth smallest gap G4. Among the first through fourth smallest gaps G1 through G4, the smallest gap is defined as the overall smallest gap Gmin.

If the difference between the first and second smallest gaps G1 and G2 is increased, the symmetrical characteristics of the heat dissipation paths in the widthwise direction are disturbed. To maintain high symmetrical characteristics of the heat dissipation paths, it is desirable to minimize the difference between the first and second smallest gaps G1 and G2. Likewise, it is desirable to minimize the difference between the third and fourth smallest gaps G3 and G4.

Figure 4:
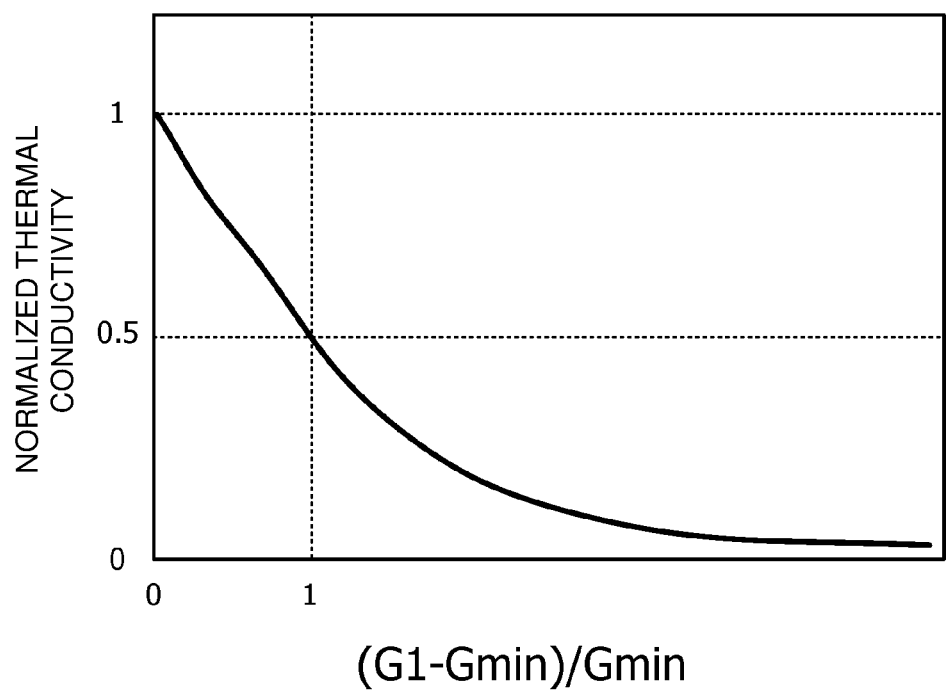
FIG. 4 is a graph illustrating the simple estimation results of the thermal conductivity in heat dissipation paths when the first smallest gap G1 is varied with respect to the overall smallest gap Gmin.

FIG. 4 is a graph illustrating the simple estimation results of the thermal conductivity in the heat dissipation paths when the first smallest gap G1 is varied with respect to the overall smallest gap Gmin. The horizontal axis indicates (G1−Gmin)/Gmin. The vertical axis indicates the normalized thermal conductivity, assuming that the thermal conductivity is 1 when the first smallest gap G1 is equal to the overall smallest gap Gmin. The graph shows that, as the first smallest gap G1 becomes greater, the normalized thermal conductivity gradually becomes smaller. When G1−Gmin becomes equal to Gmin, that is, when G1 is twice as large as Gmin, the normalized thermal conductivity is about 0.5.

When the normalized thermal conductivity becomes about 0.5 or smaller, the symmetrical characteristics of the heat dissipation paths at both sides of the ground cavity 21 are considerably disturbed, thereby making it difficult to exhibit the effect of reducing variations in the temperature rise. To sufficiently reduce variations in the temperature rise, G1−Gmin is desirably set to be smaller than Gmin Focusing only on the first and second smallest gaps G1 and G2 in the widthwise direction, the smaller one of them is defined as the overall smallest gap Gmin. To sufficiently reduce variations in the temperature rise in the widthwise direction, the difference between the first and second smallest gaps G1 and G2 is preferably set to be smaller than the overall smallest gap Gmin.

To sufficiently reduce variations in the temperature rise in the longitudinal direction, the difference between the third and fourth smallest gaps G3 and G4 is preferably set to be smaller than the overall smallest gap Gmin. To sufficiently reduce variations in the temperature rise both in the widthwise direction and in the longitudinal direction, the difference between the maximum value and the minimum value of the first through fourth smallest gaps G1 through G4 is preferably set to be smaller than the overall smallest gap Gmin.

In the first embodiment, the second via-conductors 13 are not connected to the conductive patterns of the first conductive layer L1. Hence, the second via-conductors 13 connected to the ground bump 51 can be disposed to overlap the conductive pattern L12 of the first conductive layer L1 connected to the output bump 52, as viewed from above. With this arrangement, even when the ground bump 51 and the output bump 52, that is, the ground cavity 21 and the output cavity 22, are located close to each other, a region for disposing the second via-conductors 13 can be reserved at the side closer to the output cavity 22 as viewed from the ground cavity 21.

Modified examples of the first embodiment will now be described below.

In the first embodiment, the first via-conductors 12 extend from the conductive pattern L11 of the first conductive layer L1, which is the topmost layer, and reaches the ground conductor 15 of the sixth conductive layer L6, which is the bottommost layer. However, instead of being disposed until the ground conductor 15 of the sixth conductive layer L6, the first via-conductors 12 may extend until the ground conductor 15 of one of the second through fifth conductive layers L2 through L5. Under the bottommost conductive layer to which the first via-conductors 12 extend, via-conductors other than the first via-conductors 12 form heat dissipation paths.

In the first embodiment, the second via-conductors 13 extend from the ground conductor 15 of the second conductive layer L2 until the ground conductor 15 of the sixth conductive layer L6, which is the bottommost layer. However, the second via-conductors 13 may extend from the ground conductor 15 of the third conductive layer L3 until the ground conductor 15 of the sixth conductive layer L6. The second via-conductors 13 may alternatively extend from the ground conductor 15 of the second or third conductive layer L2 or L3 until the ground conductor 15 of the conductive layer one below the second or third conductive layer L2 or L3.

In these modified examples, too, the symmetrical characteristics of the heat dissipation paths from the first conductive layer L1 to the third conductive layer L3 or from the first conductive layer L1 to the fourth conductive layer L4 can be maintained to some extent. Variations in the thermal conductivity in heat dissipation paths of the conductive layers located closer to the semiconductor device 50 are more likely to cause variations in the temperature rise than those located farther away from the semiconductor device 50. By maintaining the symmetrical characteristics of the heat dissipation paths of the conductive layers located closer to the semiconductor device 50, variations in the temperature rise can be reduced.

The plural first via-conductors 12 and the plural second via-conductors 13 are preferably connected to each other within the same conductive layer, which is at least one of the second and third conductive layers L2 and L3. This configuration can form the shortest heat dissipation paths from the first via-conductors 12 to the corresponding second via-conductors 13.

In the first embodiment, the plural second via-conductors 13 are disposed to sandwich the ground cavity 21 both in the widthwise direction and in the longitudinal direction. However, the plural second via-conductors 13 may be disposed to sandwich the ground cavity 21 in one of the widthwise direction and the longitudinal direction. For example, the plural second via-conductors 13 may be located to sandwich the ground cavity 21 only in the widthwise direction or only in the longitudinal direction. In other words, when one of the longitudinal direction and the widthwise direction is defined as a first direction, at least two of the second via-conductors 13 are disposed to sandwich the ground cavity 21 in the first direction, as viewed from above. In this case, variations in the temperature rise can be reduced with respect to the first direction. Additionally, at least two of the second via-conductors 13 are disposed to sandwich the ground cavity 21 in a second direction perpendicular to the first direction, as viewed from above. In this case, variations in the temperature rise can be reduced with respect to the second direction.

Second Embodiment

A multilayer wiring substrate 10 according to a second embodiment will be described below with reference to FIG. 5. Elements configured similarly to those of the multilayer wiring substrate 10 of the first embodiment (FIGS. 1A, 1B, 2, and 4) will not be explained.

Figure 5:
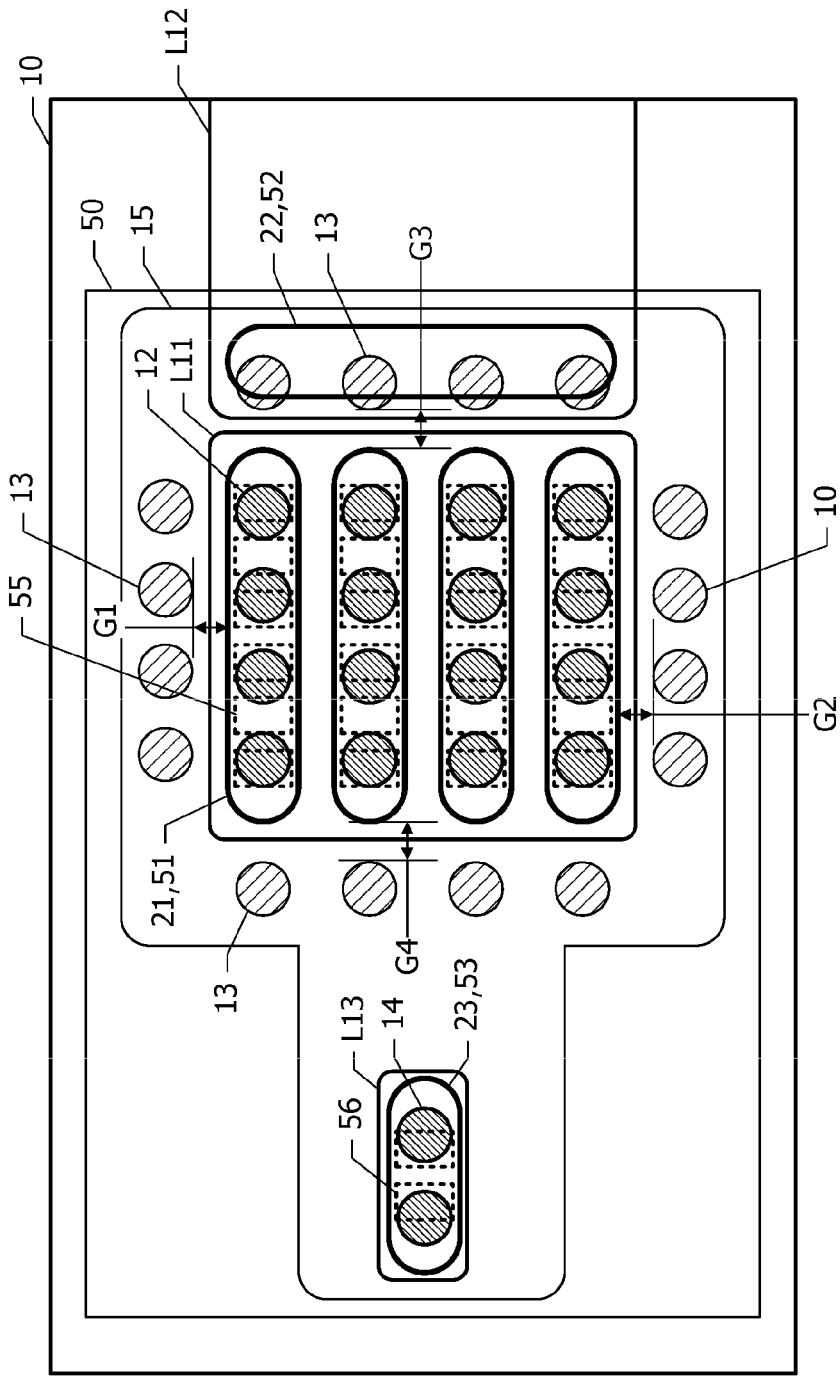
FIG. 5 is a plan view illustrating the positional relationships among the elements of a multilayer wiring substrate according to a second embodiment and those of a semiconductor device mounted on the multilayer wiring substrate.

FIG. 5 is a plan view illustrating the positional relationships among the elements of the multilayer wiring substrate 10 according to the second embodiment and those of a semiconductor device 50 mounted on the multilayer wiring substrate 10. In the first embodiment, the plural output-stage transistor cells 55 are arranged in one row in the longitudinal direction of the ground cavity 21. In the second embodiment, plural output-stage transistor cells 55 are arranged in four rows, and each row is parallel with the longitudinal direction of the ground cavity 21, as in the first embodiment. While the vertical direction corresponds to the longitudinal direction in FIG. 1A, the horizontal direction corresponds to the longitudinal direction in FIG. 5. The operating regions of the plural output-stage transistor cells 55 each have a planar shape elongated in a direction parallel with the widthwise direction of the ground cavity 21, as in the first embodiment.

Plural first via-conductors 12 and one ground cavity 21 are disposed for each row of the output-stage transistor cells 55. The positional relationships among the output-stage transistor cells 55 of each row, the corresponding first via-conductors 12, and the corresponding ground cavity 21 are similar to those in the multilayer wiring substrate 10 of the first embodiment. The dimensions of the four ground cavities 21 in the longitudinal direction are the same, and the positions at ends of the four ground cavities 21 in the longitudinal direction are aligned with each other.

The conductive pattern L11 of the first conductive layer L1 is disposed to include the four cavities 21 therein as viewed from above. Plural second via-conductors 13 are disposed to sandwich the four cavities 21 collectively therebetween in the widthwise direction and in the longitudinal direction, instead of sandwiching the four cavities 21 individually therebetween in the widthwise direction and in the longitudinal direction. For example, the plural second via-conductors 13 are disposed to sandwich the conductive pattern L11, which includes the plural output-stage transistor cells 55 therein as viewed from above, in the widthwise direction and in the longitudinal direction. Concerning the longitudinal direction, two second via-conductors 13 are located to sandwich each ground cavity 21.

In the first embodiment, the output cavity 22 (FIG. 1A) is disposed at a position separate from the ground cavity 21 in the widthwise direction. In the second embodiment, the single output cavity 22 is disposed at a position separate from the four ground cavities 21 in the longitudinal direction. The output cavity 22 has a planar shape elongated in a direction perpendicular to the longitudinal direction of the ground cavities 21.

In the first embodiment, the plural driver-stage transistor cells 56 (FIG. 1A) are disposed at positions separate from the ground cavity 21 in the widthwise direction. In the second embodiment, plural driver-stage transistor cells 56 are disposed at positions separate from the four ground cavities 21 in the longitudinal direction. The plural driver-stage transistor cells 56 are arranged side by side in the longitudinal direction of the ground cavities 21. A ground cavity 23 corresponding to the driver-stage transistor cells 56 has a planar shape elongated in a direction parallel with the longitudinal direction of the ground cavities 21.

In the second embodiment as well as in the first embodiment, the first through fourth smallest gaps G1 through G4 and the overall smallest gap Gmin are defined. Relationships among the first through fourth smallest gaps G1 through G4 and the overall smallest gap Gmin similar to those in the first embodiment are satisfied.

Advantages of the second embodiment will be discussed below.

In the second embodiment as well as in the first embodiment, the plural second via-conductors 13 are disposed around the ground cavities 21. The average temperature rise can thus be regulated, and variations in the temperature rise can also be reduced. In the second embodiment, the plural second via-conductors 13 are disposed around the single conductive pattern L11 including the plural ground cavities 21 therein as viewed from above. This configuration can reduce the area made up by the output-stage transistor 57 (FIGS. 3A and 3B) to be smaller than the configuration in which second via-conductors 13 are disposed around each of the ground cavities 21.

Modified examples of the second embodiment will be discussed below.

Although the output-stage transistor cells 55 are arranged in four rows in the second embodiment, they may be arranged in any multiple number of rows. In the second embodiment, one ground cavity 21 is provided for one row of output-stage transistor cells 55. Alternatively, the output-stage transistor cells 55 for one row may be divided into multiple groups, and a ground cavity 21 may be provided for each of the groups. One ground cavity 21 may alternatively be provided for multiple rows of output-stage transistor cells 55 adjacent to each other in the widthwise direction of the ground cavities 21.

Third Embodiment

A multilayer wiring substrate 10 according to a third embodiment will be described below with reference to FIG. 6. Elements configured similarly to those of the multilayer wiring substrate 10 of the first embodiment (FIGS. 1A, 1B, 2, and 4) will not be explained.

Figure 6:
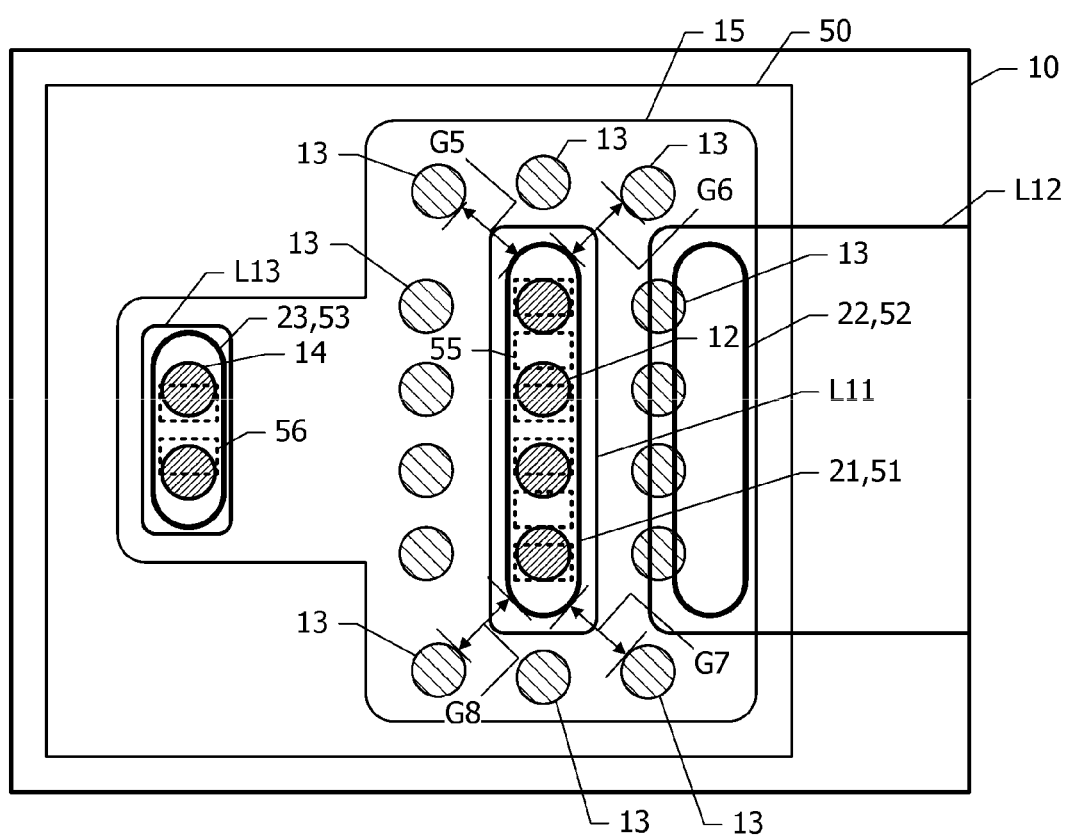
FIG. 6 is a plan view illustrating the positional relationships among the elements of a multilayer wiring substrate according to a third embodiment and those of a semiconductor device mounted on the multilayer wiring substrate.

FIG. 6 is a plan view illustrating the positional relationships among the elements of the multilayer wiring substrate 10 according to the third embodiment and those of a semiconductor device 50 mounted on the multilayer wiring substrate 10. In the first embodiment, the second via-conductors 13 are disposed to sandwich the ground cavity 21 in two directions, that is, the widthwise direction and the longitudinal direction. In the third embodiment, second via-conductors 13 are also disposed to sandwich a ground cavity 21 in oblique directions as well as in the widthwise direction and the longitudinal direction. It is assumed that in FIG. 6, the widthwise direction of the ground cavity 21 is defined as the left-right direction and the longitudinal direction of the ground cavity 21 is defined as the top-bottom direction. In this case, among the plural second via-conductors 13, at least four second via-conductors 13 are obliquely located at the top left, top right, bottom right, and bottom left positions with respect to the ground cavity 21.

Advantages of the third embodiment will be discussed below.

In the third embodiment, some second via-conductors 13 are disposed to sandwich the ground cavity 21 also in oblique directions, thereby making it possible to further reduce variations in the temperature rise. Gaps between the ground cavity 21 and the second via-conductors 13 obliquely located at the top left, top right, bottom right, and bottom left positions with respect to the ground cavity 21 are respectively represented by G5, G6, G7, and G8. After examining the desirable arrangement of the second via-conductors 13 in a manner similar to the first embodiment using the graph in FIG. 4, it is found that the difference between the maximum value and the minimum value of the fifth through eighth smallest gaps G5 through G8 is desirably smaller than the minimum value of the fifth through eighth smallest gaps G5 through G8. Arranging the second via-conductors 13 to satisfy this condition can further reduce variations in the temperature rise.

Fourth Embodiment

A multilayer wiring substrate 10 according to a fourth embodiment will be described below with reference to FIG. 7. Elements configured similarly to those of the multilayer wiring substrate 10 of the first embodiment (FIGS. 1A, 1B, 2, and 4) will not be explained.

Figure 7:
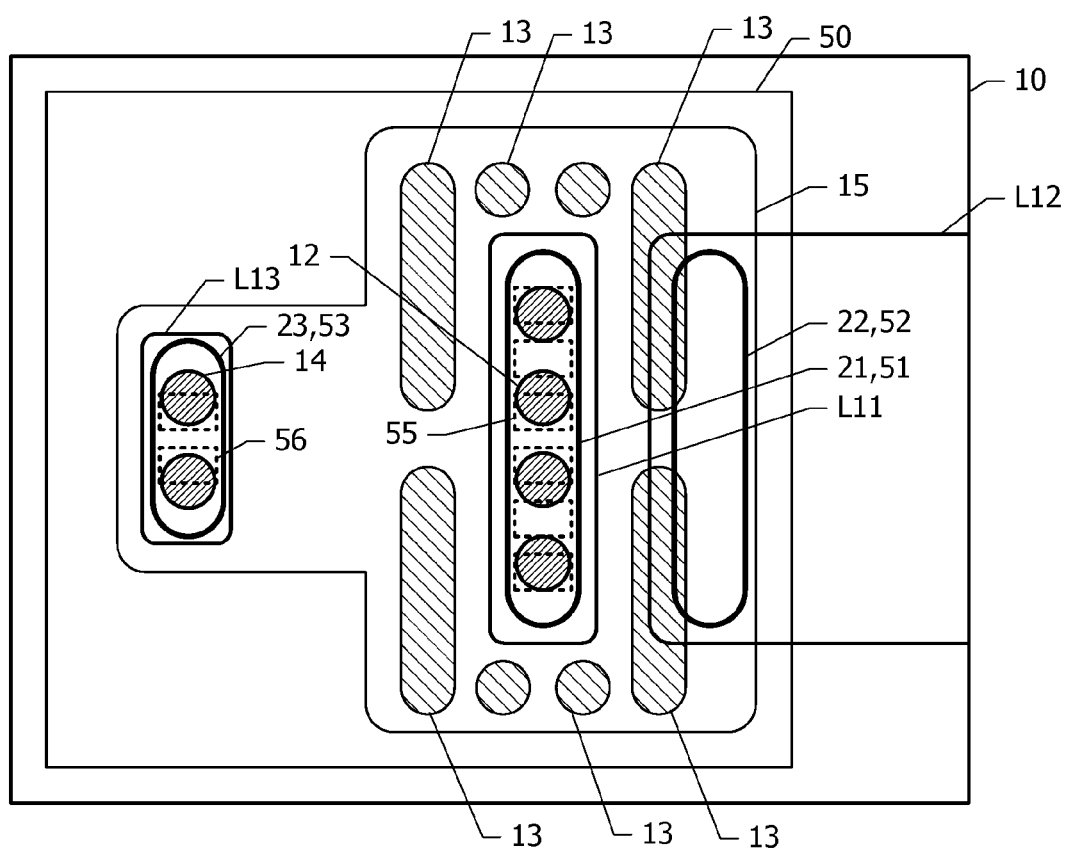
FIG. 7 is a plan view illustrating the positional relationships among the elements of a multilayer wiring substrate according to a fourth embodiment and those of a semiconductor device mounted on the multilayer wiring substrate.

FIG. 7 is a plan view illustrating the positional relationships among the elements of the multilayer wiring substrate 10 according to the fourth embodiment and those of a semiconductor device 50 mounted on the multilayer wiring substrate 10. In the first embodiment, the plural second via-conductors 13 are formed in a substantially circular shape as viewed from above. In the fourth embodiment, at least some of the plural second via-conductors 13 have a planar shape elongated in one direction. In the fourth embodiment, two second via-conductors 13 having a planar shape elongated in the longitudinal direction of a ground cavity 21 are disposed at each side of the ground cavity 21 in the widthwise direction.

As viewed from above, the plural second via-conductors 13 are arranged line-symmetrically to each other with respect to a line parallel with the longitudinal direction of the ground cavity 21 and also with respect to a line parallel with the widthwise direction of the ground cavity 21.

Advantages of the fourth embodiment will be discussed below.

In the fourth embodiment, the plural second via-conductors 13 are arranged line-symmetrically to each other as viewed from above, thereby making it possible to further reduce variations in the temperature rise.

Modified examples of the fourth embodiment will be discussed below.

In the fourth embodiment, the second via-conductors 13 disposed at each side of the ground cavity 21 in the widthwise direction have a planar shape elongated in one direction (longitudinal direction). Alternatively, second via-conductors 13 having a planar shape elongated in the widthwise direction of the ground cavity 21 may be disposed to sandwich the ground cavity 21 in the longitudinal direction.

Fifth Embodiment

A multilayer wiring substrate 10 according to a fifth embodiment will be described below with reference to FIGS. 8 and 9. Elements configured similarly to those of the multilayer wiring substrate 10 of the first embodiment (FIGS. 1A, 1B, 2, and 4) will not be explained.

Figure 8:
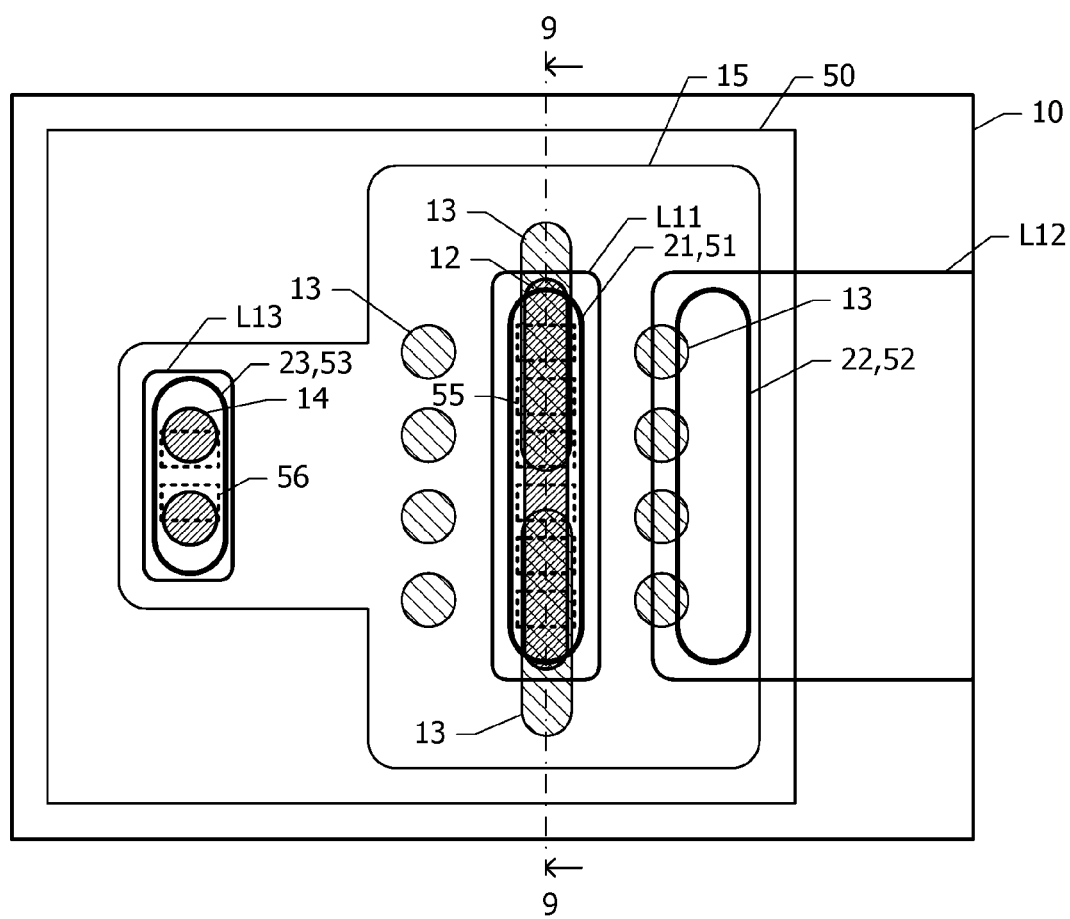
FIG. 8 is a plan view illustrating the positional relationships among the elements of a multilayer wiring substrate according to a fifth embodiment and those of a semiconductor device mounted on the multilayer wiring substrate.

FIG. 8 is a plan view illustrating the positional relationships among the elements of the multilayer wiring substrate 10 according to the fifth embodiment and those of a semiconductor device 50 mounted on the multilayer wiring substrate 10. FIG. 9 is a sectional view taken along long dashed dotted line 9-9 in FIG. 8.

In the first embodiment, the first via-conductors 12 (FIG. 2) extend from the conductive pattern L11 of the first conductive layer L1 until the ground conductor 15 of the sixth conductive layer L6. In the fifth embodiment, a first via-conductor 12 (FIG. 9) extends from the conductive pattern L11 of the first conductive layer L1 only until the ground conductor 15 of the second conductive layer L2. Instead, second via-conductors 13 are disposed to overlap the ground cavity 21 as viewed from above, and extend from the ground conductor 15 of the second conductive layer L2 until the ground conductor 15 of the sixth conductive layer L6.

In the first embodiment, among the plural second via-conductors 13, two second via-conductors 13 (FIG. 1A) are disposed separately in the longitudinal direction as viewed from the ground cavity 21. In the fifth embodiment, among the plural second via-conductors 13, two second via-conductors 13 extend from inside the ground cavity 21 toward both ends in the longitudinal direction so as to protrude from the ground cavity 21, as viewed from above.

The second via-conductors 13 partially overlapping the ground cavity 21 in the longitudinal direction are included in the ground cavity 21 in the widthwise direction, as viewed from above. Conversely, the ground cavity 21 may be included in the second via-conductors 13 in the widthwise direction, as viewed from above. In other words, concerning the positional relationship between the ground cavity 21 and the second via-conductors 13, one of them extends to outside the other at both sides in the widthwise direction.

Concerning the first via-conductor 12, only one first via-conductor 12 elongated in the longitudinal direction of the ground cavity 21 is disposed for the ground cavity 21. The first via-conductor 12 partially overlaps the ground cavity 21 as viewed from above. The first via-conductor 12 and the ground cavity 21 satisfy symmetrical characteristics both in the longitudinal direction and in the widthwise direction in terms of the shape and the positional relationship in a plan view.

Advantages of the fifth embodiment will be discussed below.

In the fifth embodiment, as viewed from above, some of the second via-conductors 13 are located to partially overlap the ground cavity 21 and extend from inside the ground cavity 21 to outside the ground cavity 21 at both ends in the longitudinal direction. With this arrangement, as in the first embodiment in which the second via-conductors 13 are disposed at positions separate from the ground cavity 21 in the longitudinal direction, the average temperature rise can be regulated, and variations in the temperature rise in the longitudinal direction can also be reduced.

To enhance the effect of regulating the average temperature rise and reducing variations in the temperature rise, the lengths by which the second via-conductors 13 protrude from both ends of the ground cavity 21 in the longitudinal direction are preferably equal to each other.

Additionally, concerning the positional relationship between the ground cavity 21 and the second via-conductors 13, one of them extends to outside the other at both sides in the widthwise direction. This enhances the symmetrical characteristics of the ground cavity 21 and the second via-conductors 13 in the widthwise direction, compared with the configuration in which one of the ground cavity 21 and the second via-conductors 13 extends to outside the other only at one side in the widthwise direction. It is thus possible to reduce variations in the temperature rise also in the widthwise direction.

Modified examples of the fifth embodiment will be discussed below.

In the fifth embodiment, the single first via-conductor 12 elongated in the longitudinal direction of the ground cavity 21 is disposed for the ground cavity 21. As in the first embodiment (FIGS. 1A and 2), plural first via-conductors 12 may be disposed. In the fifth embodiment, two second via-conductors 13 are disposed to partially overlap the ground cavity 21. However, one or three or more second via-conductors 13 may be disposed to partially overlap the ground cavity 21.

Sixth Embodiment

A multilayer wiring substrate 10 according to a sixth embodiment will be described below with reference to FIG. 10. Elements configured similarly to those of the multilayer wiring substrate 10 of the fifth embodiment (FIGS. 8 and 9) will not be explained.

Figure 10:
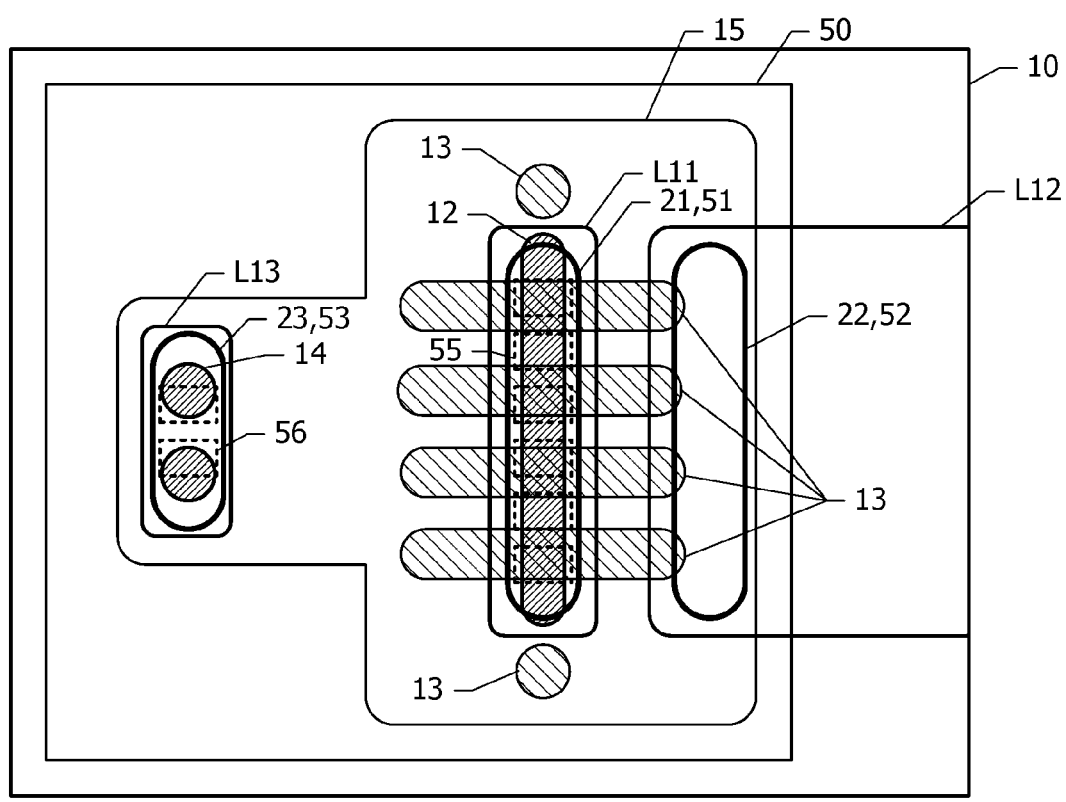
FIG. 10 is a plan view illustrating the positional relationships among the elements of a multilayer wiring substrate according to a sixth embodiment and those of a semiconductor device mounted on the multilayer wiring substrate.

FIG. 10 is a plan view illustrating the positional relationships among the elements of the multilayer wiring substrate 10 according to the sixth embodiment and those of a semiconductor device 50 mounted on the multilayer wiring substrate 10. In the fifth embodiment, as viewed from above, second via-conductors 13 extend from inside the ground cavity 21 toward both ends in the longitudinal direction so as to protrude from the ground cavity 21. In the sixth embodiment, as viewed from above, plural second via-conductors 13 elongated in the widthwise direction of the ground cavity 21 are disposed to intersect the ground cavity 21. In other words, at least some of the plural second via-conductors 13 extend from inside the ground cavity 21 toward both sides in the widthwise direction so as to protrude from the ground cavity 21.

Advantages of the sixth embodiment will be discussed below.

In the sixth embodiment, as a result of disposing plural second via-conductors 13 elongated in the widthwise direction of the ground cavity 21, the average temperature rise can be regulated, and variations in the temperature rise in the widthwise direction can also be reduced. To enhance the effect of regulating the average temperature rise and reducing variations in the temperature rise, the lengths by which the second via-conductors 13 protrude from both ends of the ground cavity 21 in the widthwise direction are preferably equal to each other.

Seventh Embodiment

A multilayer wiring substrate 10 according to a seventh embodiment will be described below with reference to FIG. 11. Elements configured similarly to those of the multilayer wiring substrate 10 of the second embodiment (FIG. 5) will not be explained.

Figure 11:
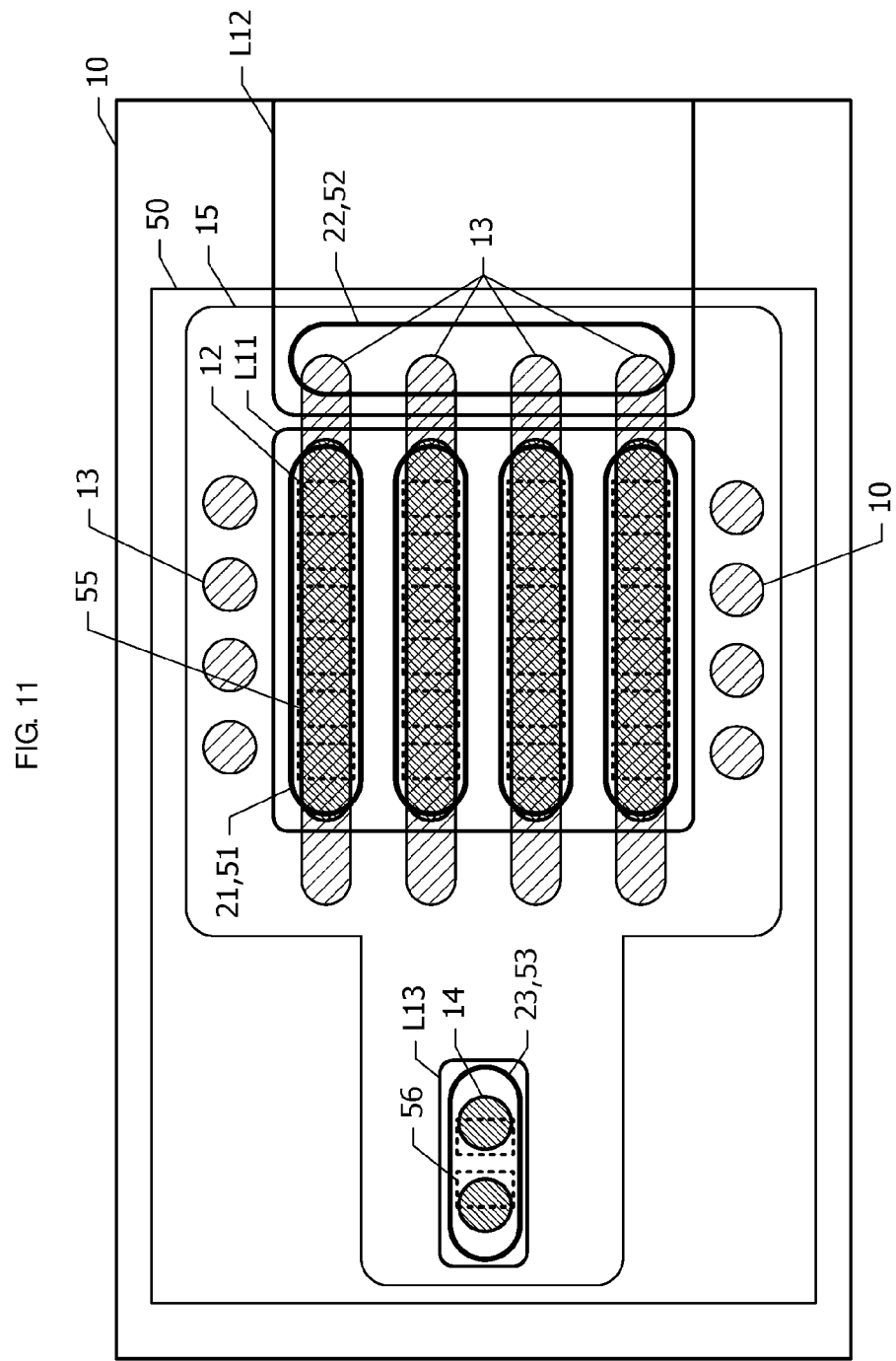
FIG. 11 is a plan view illustrating the positional relationships among the elements of a multilayer wiring substrate according to a seventh embodiment and those of a semiconductor device mounted on the multilayer wiring substrate.

FIG. 11 is a plan view illustrating the positional relationships among the elements of the multilayer wiring substrate 10 according to the seventh embodiment and those of a semiconductor device 50 mounted on the multilayer wiring substrate 10. In the seventh embodiment, as well as in the second embodiment, plural ground cavities 21 having a planar shape elongated in one direction are arranged in parallel with each other.

In the second embodiment (FIG. 5), as viewed from above, the second via-conductors 13 are disposed separately at both sides of each ground cavity 21 in the longitudinal direction. In the seventh embodiment, one second via-conductor 13 is disposed for each ground cavity 21. As viewed from above, each second via-conductor 13 extends from inside the associated ground cavity 21 toward both sides in the longitudinal direction so as to protrude from the ground cavity 21.

Figure 9:
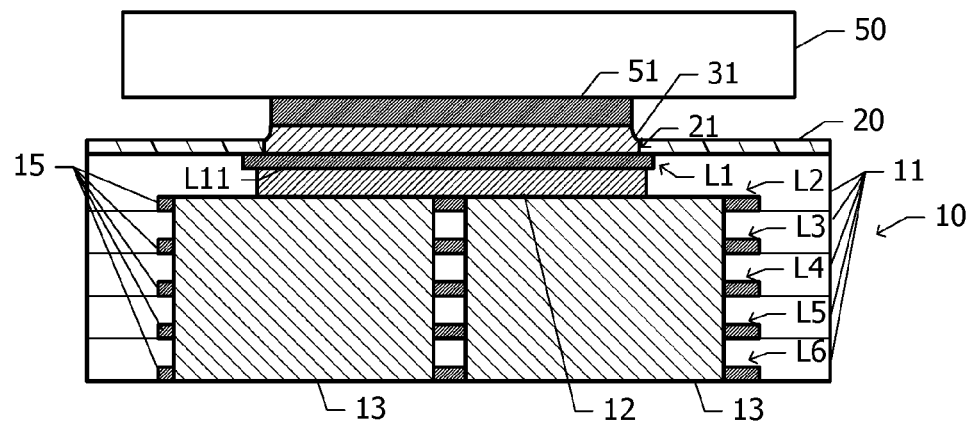
FIG. 9 is a sectional view taken along long dashed dotted line 9-9 in FIG. 8.

The positional relationship between a first via-conductor 12 and the associated ground cavity 21 is similar to that in the fifth embodiment (FIGS. 8 and 9). That is, one first via-conductor 12 elongated in the longitudinal direction of the ground cavity 21 is disposed for each ground cavity 21. The first via-conductor 12 partially overlaps the associated ground cavity 21 as viewed from above. The first via-conductor 12 and the ground cavity 21 satisfy symmetrical characteristics both in the longitudinal direction and in the widthwise direction in terms of the shape and the positional relationship in a plan view.

As in the fifth embodiment (FIG. 9), the first via-conductor 12 extends from the conductive pattern L11 of the first conductive layer L1 until the ground conductor 15 of the second conductive layer L2. The second via-conductors 13 each extend from the ground conductor 15 of the second conductive layer L2 until the ground conductor 15 of the sixth conductive layer L6.

Advantages of the seventh embodiment will be discussed below.

The first via-conductor 12 and the ground cavity 21 satisfy symmetrical characteristics both in the longitudinal direction and in the widthwise direction in terms of the shape and the positional relationship in a plan view. In the layer having the first via-conductor 12, the symmetrical characteristics of heat dissipation paths are enhanced both in the longitudinal direction and in the widthwise direction. It is thus possible to reduce variations in the temperature rise in the longitudinal direction and in the widthwise direction.

Additionally, as viewed from above, the second via-conductors 13 extend from inside the associated ground cavities 21 to outside the ground cavities 21 in the longitudinal direction, thereby making it possible to reduce variations in the temperature rise in the longitudinal direction. More heat dissipation paths are formed, thereby making it possible to further regulate the average temperature rise.

Eighth Embodiment

A multilayer wiring substrate 10 according to an eighth embodiment will be described below with reference to FIGS. 12 through 14C. Elements configured similarly to those of the multilayer wiring substrate 10 of the first embodiment (FIGS. 1A, 1B, 2, and 4) will not be explained.

Figure 12:
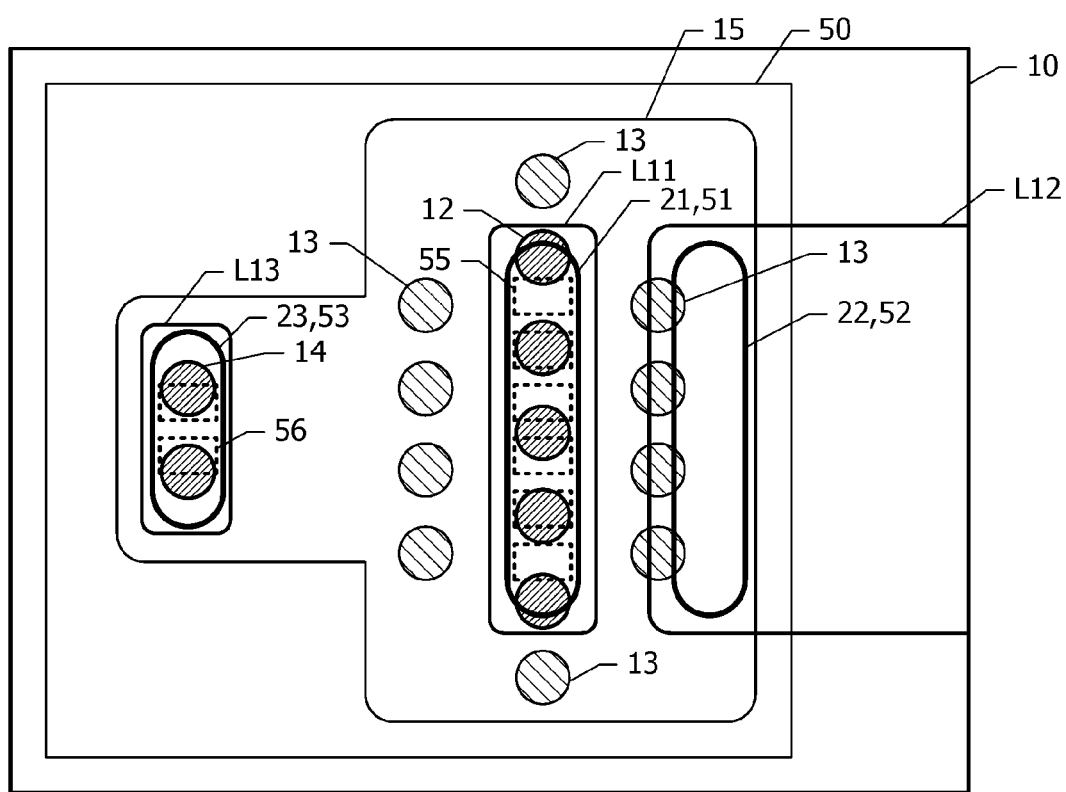
FIG. 12 is a plan view illustrating the positional relationships among the elements of a multilayer wiring substrate according to an eighth embodiment and those of a semiconductor device mounted on the multilayer wiring substrate.

FIG. 12 is a plan view illustrating the positional relationships among the elements of the multilayer wiring substrate 10 according to the eighth embodiment and those of a semiconductor device 50 mounted on the multilayer wiring substrate 10. In the first embodiment, the plural first via-conductors 12 are included in the ground cavity 21 as viewed from above. In the eighth embodiment, among first via-conductors 12 arranged in the longitudinal direction of a ground cavity 21, first via-conductors 12 located at both ends extend from inside the ground cavity 21 toward both ends in the longitudinal direction so as to protrude from the ground cavity 21.

Concerning the widthwise direction, the first via-conductors 12 are included in the ground cavity 21 as viewed from above. For example, the first via-conductors 12 and the ground cavity 21 satisfy symmetrical characteristics in the widthwise direction in terms of the shape and the positional relationship in a plan view.

Advantages of the eighth embodiment will be discussed below.

In the eighth embodiment, two first via-conductors 12 extend from inside the ground cavity 21 toward both ends in the longitudinal direction so as to protrude from the ground cavity 21. This further enhances the uniformity of the thermal conductivity in heat dissipation paths in the longitudinal direction. It is thus possible to further reduce variations in the temperature rise.

Desirable lengths by which the first via-conductors 12 protrude from the ground cavity 21 will be discussed below with reference to FIG. 13. The lengths of the first via-conductors 12 protruding from both ends of the ground cavity 21 will be indicated by P3 and P4. The thermal conductivity in the protruding portions of the first via-conductors 12 has been estimated in relation to the lengths of the protruding portions.

Figure 13:
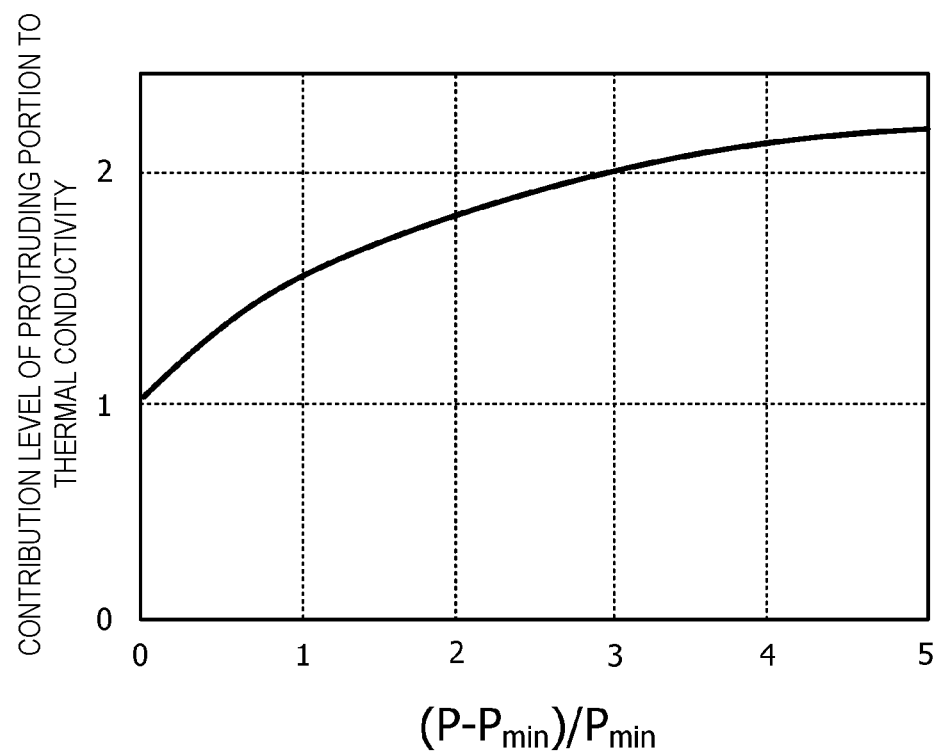
FIG. 13 is a graph illustrating the estimation results of the level of contribution of protruding portions of first via-conductors to the thermal conductivity in relation to the lengths of the protruding portions.

FIG. 13 is a graph illustrating the estimation results of the level of contribution of the protruding portions of the first via-conductors 12 to the thermal conductivity in relation to the lengths of the protruding portions. The horizontal axis indicates the value ((Pmax−Pmin)/Pmin) obtained by normalizing the difference between the maximum value Pmax and the minimum value Pmin of the lengths P3 and P4 of the protruding portions by Pmin. The vertical axis indicates the ratio of the contribution level of the protruding portion having a length P to the thermal conductivity to that of the protruding portion having a length Pmin to the thermal conductivity.

Approximately, the contribution level of a protruding portion of the first via-conductor 12 is inversely proportional to the distance from the end portion of the ground cavity 21 to that of the protruding portion. That is, the ratio of the contribution level of a protruding portion having the distance P to that of a protruding portion having the distance Pmin is substantially proportional to Pmin/P. The length P of the protruding portion is normalized by Pmin, resulting in P/Pmin. P/Pmin is integrated in a range from 1 to P/Pmin, resulting in log(P/Pmin). The contribution level of the protruding portion having a length Pmin is normalized to 1. The value 1 is added to log(P/Pmin), resulting in log((P/Pmin)+1), which is the value on the vertical axis of the graph in FIG. 13.

If the value of the horizontal axis is indicated by x and the value of the vertical axis is indicated by y, the graph in FIG. 13 is represented by y=log(x+1)+1. When P=2×Pmin, the ratio of the contribution level of the protruding portion having a length P to the thermal conductivity to that of the protruding portion having a length Pmin to the thermal conductivity is about 1.5. Concerning the contribution levels of the protruding portions at both ends of the ground cavity 21 in the longitudinal direction to the thermal conductivity, when the ratio of a higher contribution level to a lower contribution level is about 1.5 or smaller, variations in the uniformity of the power amplifying characteristics of the plural output-stage transistor cells 55 may safely be ignored. It is thus preferable that the difference between the length P3 of the protruding portion at one end of the ground cavity 21 and the length P4 of the protruding portion at the other end of the ground cavity 21 in the longitudinal direction, that is, |P3−P4|, is smaller than the smaller value Pmin of the lengths P3 and P4 of the protruding portions. In other words, the larger one of the lengths P3 and P4 of the protruding portions is preferably less than the value twice as large as the smaller one of the lengths P3 and P4.

Modified examples of the eighth embodiment will be discussed below with reference to FIGS. 14A, 14B, and 14C.

Figure 14A:
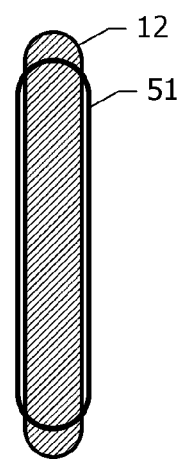
FIGS. 14A, 14B, and 14C are plan views illustrating the positional relationships between ground cavities and first via-conductors of multilayer wiring substrates according to modified examples of the eighth embodiment.
Figure 14B:
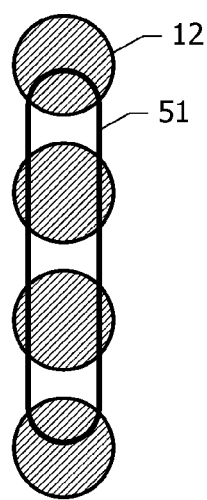
Figure 14C:
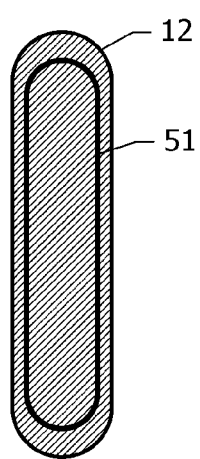

FIGS. 14A, 14B, and 14C are plan views illustrating the positional relationships between ground cavities 21 and first via-conductors 12 of multilayer wiring substrates according to modified examples of the eighth embodiment. In the eighth embodiment, plural first via-conductors 12 are disposed for one ground cavity 21. In the modified example in FIG. 14A, one first via-conductor 12 elongated in the longitudinal direction of the ground cavity 21 is disposed for the single ground cavity 21. As viewed from above, the first via-conductor 12 extends from inside the ground cavity 21 toward both ends in the longitudinal direction so as to protrude from the ground cavity 21. In the widthwise direction, the first via-conductor 12 is included in the ground cavity 21 therein as viewed from above.

In the modified example in FIG. 14B, among plural first via-conductors 12 arranged in the longitudinal direction, first via-conductors 12 disposed at both ends protrude from the ground cavity 21 in the longitudinal direction. The plural first via-conductors 12 protrude from the ground cavity 21 in the widthwise direction. In the modified example in FIG. 14C, the single first via-conductor 12 protrudes from both ends of the ground cavity 21 in the longitudinal direction and also protrudes from both sides of the ground cavity 21 in the widthwise direction.

In all the modified examples in FIGS. 14A, 14B, and 14C, the first via-conductor 12 or first via-conductors 12 and the ground cavity 21 satisfy symmetrical characteristics in the widthwise direction in terms of the shape and the positional relationship in a plan view. It is thus possible to reduce variations in the temperature rise in the widthwise direction, as in the eighth embodiment.

In all the modified examples in FIGS. 14A, 14B, and 14C, the first via-conductor 12 or first via-conductors 12 protrude from both ends of the ground cavity 21 in the longitudinal direction. It is thus possible to reduce variations in the temperature rise in the longitudinal direction, as in the eighth embodiment.

As in the modified examples in FIGS. 14A and 14C, the first via-conductor 12 is elongated in the longitudinal direction of the ground cavity 21. This further increases the thermal conductivity to regulate the average temperature rise and also further reduces variations in the temperature rise among the plural output-stage transistor cells 55.

The disclosure is not limited to the above-described embodiments and modified examples. The configurations described in some of the embodiments and modified examples may partially be replaced by or combined with each other. Similar advantages obtained by similar configurations in plural embodiments are not repeated in the individual embodiments.

While preferred embodiments of the disclosure have been described above, it is to be understood that variations, improvements, combinations, and modifications will be apparent to those skilled in the art without departing from the scope and spirit of the disclosure. The scope of the disclosure, therefore, is to be determined solely by the following claims.

What is claimed is:

1. A multilayer wiring substrate including conductive layers and insulating layers alternately stacked on each other, each of the conductive layers having a conductive pattern, a semiconductor device being mounted on a top surface of the multilayer wiring substrate, the multilayer wiring substrate comprising:
    a protective film that covers the conductive pattern of a first conductive layer of the conductive layers, the first conductive layer being a topmost layer of the conductive layers, at least one cavity being formed in the protective film to expose part of the conductive pattern of the first conductive layer, the at least one cavity being elongated in one direction;
    at least one first via-conductor that extends downward from the conductive pattern of the first conductive layer at least until the conductive pattern of a second conductive layer of the conductive layers, the second conductive layer being a second layer; and
    a plurality of second via-conductors that extend downward from the conductive pattern of the second conductive layer or a third conductive layer of the conductive layers, the third conductive layer being a third layer, at least until the conductive pattern of a conductive layer of the conductive layers one below the second conductive layer or the third conductive layer, wherein
    when one of a longitudinal direction of the at least one cavity and a direction perpendicular to the longitudinal direction and parallel with the top surface of the multilayer wiring substrate is defined as a first direction,
    as viewed from above,
    the at least one first via-conductor and the at least one cavity partially overlap each other,
    at least two of the plurality of second via-conductors are disposed separately from the at least one cavity so as to sandwich the at least one cavity therebetween in the first direction,
    among the second via-conductors sandwiching the at least one cavity therebetween in the first direction, a smallest gap between the at least one cavity and at least one second via-conductor disposed at one side of the at least one cavity is defined as a first smallest gap, a smallest gap between the at least one cavity and at least one second via-conductor disposed at an other side of the at least one cavity is defined as a second smallest gap, a smallest gap between the at least one cavity and the second via-conductors is defined as an overall smallest gap, and a difference between the first smallest gap and the second smallest gap is smaller than the overall smallest gap.

2. The multilayer wiring substrate according to claim 1, wherein the conductive pattern of the first conductive layer exposed in the at least one cavity as viewed from above is a land configured to connect to a bump of the semiconductor device.

3. The multilayer wiring substrate according to claim 2, wherein the first direction is perpendicular to the longitudinal direction of the at least one cavity.

4. The multilayer wiring substrate according to claim 2, wherein:
    as viewed from above, at least two of the plurality of second via-conductors are disposed separately from the at least one cavity so as to sandwich the at least one cavity therebetween in a second direction perpendicular to the first direction; and
    among the second via-conductors sandwiching the at least one cavity therebetween in the second direction, the smallest gap between the at least one cavity and at least one second via-conductor disposed at one side of the at least one cavity is defined as a third smallest gap, the smallest gap between the at least one cavity and at least one second via-conductor disposed at the other side of the at least one cavity is defined as a fourth smallest gap, and a difference between a maximum value and a minimum value of the first, second, third, and fourth smallest gaps is smaller than the overall smallest gap.

5. The multilayer wiring substrate according to claim 2, wherein, as viewed from above, the plurality of second via-conductors are arranged line-symmetrically to each other with respect to a line perpendicular to the first direction.

6. The multilayer wiring substrate according to claim 2, wherein the at least one first via-conductor and the plurality of second via-conductors are electrically connected to each other within at least one of the second and third conductive layers.

7. The multilayer wiring substrate according to claim 1, wherein the first direction is perpendicular to the longitudinal direction of the at least one cavity.

8. The multilayer wiring substrate according to claim 7, wherein:
   as viewed from above, at least two of the plurality of second via-conductors are disposed separately from the at least one cavity so as to sandwich the at least one cavity therebetween in a second direction perpendicular to the first direction; and
   among the second via-conductors sandwiching the at least one cavity therebetween in the second direction, the smallest gap between the at least one cavity and at least one second via-conductor disposed at one side of the at least one cavity is defined as a third smallest gap, the smallest gap between the at least one cavity and at least one second via-conductor disposed at the other side of the at least one cavity is defined as a fourth smallest gap, and a difference between a maximum value and a minimum value of the first, second, third, and fourth smallest gaps is smaller than the overall smallest gap.

9. The multilayer wiring substrate according to claim 7, wherein, as viewed from above, the plurality of second via-conductors are arranged line-symmetrically to each other with respect to a line perpendicular to the first direction.

10. The multilayer wiring substrate according to claim 3, wherein the at least one first via-conductor and the plurality of second via-conductors are electrically connected to each other within at least one of the second and third conductive layers.

11. The multilayer wiring substrate according to claim 1, wherein:
    as viewed from above, at least two of the plurality of second via-conductors are disposed separately from the at least one cavity so as to sandwich the at least one cavity therebetween in a second direction perpendicular to the first direction; and
    among the second via-conductors sandwiching the at least one cavity therebetween in the second direction, the smallest gap between the at least one cavity and at least one second via-conductor disposed at one side of the at least one cavity is defined as a third smallest gap, the smallest gap between the at least one cavity and at least one second via-conductor disposed at the other side of the at least one cavity is defined as a fourth smallest gap, and a difference between a maximum value and a minimum value of the first, second, third, and fourth smallest gaps is smaller than the overall smallest gap.

12. The multilayer wiring substrate according to claim 11, wherein:
    as viewed from above, when the first direction is defined as a left-right direction and the second direction is defined as a top-bottom direction, among the plurality of second via-conductors, at least four second via-conductors are obliquely located at top left, top right, bottom right, and bottom left positions with respect to the at least one cavity; and
    a difference between a maximum value and a minimum value of gaps between the at least one cavity and the at least four second via-conductors is smaller than the minimum value of the gaps between the at least one cavity and the at least four second via-conductors.

13. The multilayer wiring substrate according to claim 12, wherein, as viewed from above, the plurality of second via-conductors are arranged line-symmetrically to each other with respect to a line perpendicular to the first direction.

14. The multilayer wiring substrate according to claim 11, wherein, as viewed from above, the plurality of second via-conductors are arranged line-symmetrically to each other with respect to a line perpendicular to the first direction.

15. The multilayer wiring substrate according to claim 1, wherein, as viewed from above, the plurality of second via-conductors are arranged line-symmetrically to each other with respect to a line perpendicular to the first direction.

16. The multilayer wiring substrate according to claim 1, wherein the at least one first via-conductor and the plurality of second via-conductors are electrically connected to each other within at least one of the second and third conductive layers.

* * * * *